United States Patent [19]

Cleeves

[11] Patent Number: 5,693,556
[45] Date of Patent: Dec. 2, 1997

[54] METHOD OF MAKING AN ANTIFUSE METAL POST STRUCTURE

[75] Inventor: James M. Cleeves, Redwood City, Calif.

[73] Assignee: Cypress Semiconductor Corp., San Jose, Calif.

[21] Appl. No.: 581,032

[22] Filed: Dec. 29, 1995

[51] Int. Cl.[6] ........................................ H01L 21/70
[52] U.S. Cl. ................ 437/60; 437/195; 437/DIG. 922; 257/50; 257/530
[58] Field of Search .................. 437/60, 195, DIG. 922; 257/50, 530

[56] References Cited

U.S. PATENT DOCUMENTS

| | | | |
|---|---|---|---|
| 4,410,622 | 10/1983 | Dalal et al. | 430/312 |
| 4,917,759 | 4/1990 | Fisher et al. | 156/643 |
| 5,100,827 | 3/1992 | Lytle | 437/922 |
| 5,166,556 | 11/1992 | Hsu et al. | 437/922 |
| 5,403,778 | 4/1995 | Kwok et al. | 437/922 |
| 5,427,979 | 6/1995 | Chang | 437/922 |
| 5,436,199 | 7/1995 | Brighton | 437/789 |

*Primary Examiner*—Charles L. Bowens, Jr
*Assistant Examiner*—Lynne A. Gurley
*Attorney, Agent, or Firm*—Blakely, Sokoloff, Taylor & Zafman LLP

[57] ABSTRACT

A method of forming an antifuse device. According to the preferred method of the present invention, a first metal layer comprising a first bulk conductive layer and the top capping layer is formed. Next, the capping layer is etched into a first patterned capping layer. An antifuse layer is then formed over the patterned capping layer and over the first bulk conductive layer. Next, a second metal layer comprising a bottom barrier layer and a second bulk conductive layer is formed on the antifuse layer. The second metal layer and the antifuse layer are then etched to form a metal post on the capping layer. The first bulk conductive layer is then etched in alignment with the patterned capping layer to form a first metal interconnect.

11 Claims, 3 Drawing Sheets

METHOD OF MAKING AN ANTIFUSE METAL POST STRUCTURE

BACKGROUND OF THE INVENTION

1. Field of the Invention

The present invention relates to the field of semiconductor fabrication and more specifically to an antifuse structure and its method of fabrication in a semiconductor integrated circuit.

2. Discussion of Related Art

Integrated circuits are made up of literally millions of discrete devices such as transistors, capacitors and resistors which are interconnected together to form functional integrated circuits. In many cases, it is desirable to have an option after the fabrication of integrated circuits as to whether or not certain devices or components are to be electrically coupled together. For example, after the completion of a memory product, rows of memory cells are checked to determine which rows contain defective cells. The addresses of defective rows are then coupled to redundant rows provided in the memory circuit. In order to couple the address of defective rows to redundant rows, antifuses are provided. Antifuses are devices which can be irreversibly altered from an initial non-conductive to a conductive state by applying a voltage across it. In this way, addresses of defective rows can be coupled to redundant rows when necessary. Antifuses are also used in many logic circuits such as programmable application specific integrated circuits (ASICs). Antifuses allow substantially completed integrated circuits to be programmed to a desired functionality.

A problem with present antifuse devices is that they are generally formed between nonplanar interfaces. This results in geometry and topography induced high electric fields which detrimentally affect the performance of the antifuse device. Additionally, the nonplanar of structures typically result in the formation of "stringers" which can cause short circuits and device failures. Additionally, present methods of fabricating antifuses typically utilize complex processes which require many steps such as planarizations and cleaning which increase the cost of the fabricated transistor and which decrease the reliability and manufacturability of the process. Such complex and dirty processes affect the surface properties of the fusing structure which can detrimentally affect the quality and performance of the fabricated antifuse.

Thus, what is necessary is a simple method of fabricating a planar antifuse.

SUMMARY OF THE INVENTION

A method of forming an antifuse device between two metal layers is described. According to the present invention, a first metal layer comprising aluminum is formed. Next, a first titanium-tungsten capping layer is formed on the aluminum layer. The first titanium-tungsten capping layer is then patterned into a first patterned titanium-tungsten capping layer having a pattern desired for a first metal interconnect. An amorphous silicon antifuse layer is then formed on the first patterned titanium-tungsten capping layer and on the first metal layer comprising aluminum. Next, a titanium-tungsten barrier layer is deposited onto the amorphous silicon antifuse layer. A second metal layer comprising aluminum is then formed on the titanium-tungsten barrier layer. A photoresist layer is then formed and patterned into a photoresist mask over a location of the second metal layer where an antifuse is desired. The first aluminum layer, the titanium-tungsten barrier layer and the amorphous silicon antifuse layer are then antisotropically etched substantially in alignment with the photoresist mask to form a metal post. The first metal layer is then etched substantially in alignment with the patterned titanium-tungsten capping layer in order to form a first metal interconnect.

BRIEF DESCRIPTION OF THE DRAWINGS

FIG. 1b is an illustration of a cross-sectional overhead view showing the patterning of the titanium-tungsten capping layer formed on the substrate of FIG. 1a.

DETAILED DESCRIPTION OF THE PRESENT INVENTION

The present invention discloses a novel antifuse metal post structure and its method of fabrication in a semiconductor integrated circuit. In the following description, numerous specific details such as specific process steps, materials, etc. are set forth in order to provide a thorough understanding of the present invention. It will be obvious, however, to one skilled in the art, that the present invention may be practiced without these specific details. In other instances, well known semiconductor integrated circuit manufacturing steps and equipment have not been set forth in detail in order to not unnecessarily obscure the present invention.

According to the present invention, a substrate 100 is provided. Substrate 100 includes a semiconductor substrate such as, but not limited to, silicon in which have been formed a plurality of active and passive devices such as transistors, capacitors and resistors. Substrate 100 also includes an outermost interlayer dielectric which is used to electrically isolate a subsequently formed first metallization layer used to interconnect the various devices formed in an integrated circuit. Accordingly, a substrate is generally referred to in the present invention as the material on which layers are formed and on which processes act.

Figure 1A:
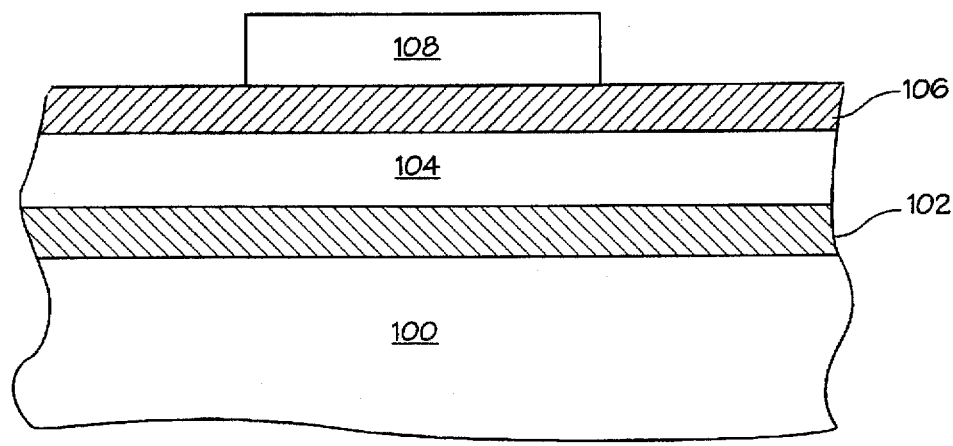
FIG. 1a is an illustration of a cross-sectional view showing the formation of a first aluminum layer and a titanium-tungsten capping layer.

According to the present invention, as shown in FIG. 1a, a first barrier layer 102 such as, but not limited to, titanium, titanium-nitride, or combinations thereof, is blanket deposited with any well known technique over substrate 100. Next, a bulk conductor 104 is blanket deposited over first barrier layer 102. Bulk conductor 104 will make up a main current carrying material of a subsequently formed interconnection (metal-1). Bulk conductor 104 preferably comprises aluminum doped with a small amount (0.5%) of copper, but may also be any other low resistance material such as, but not limited to, gold, copper, tungsten and silver, and combinations thereof. Bulk conductor 104 is formed thick enough to provide a suitable low resistance interconnect for the fabricated interconnect. Although a barrier layer 102 is not required, it is preferred because it helps prevent diffusion of bulk conductor 104 into substrate 100 and provides adhesion to substrate 100.

Next, according to the present invention, a capping layer 106 is blanket deposited with any well known technique over bulk conductor 104. Capping layer 106 is preferably a titanium-tungsten layer formed to a thickness of approximately 2000 Å by sputtering from a titanium-tungsten target comprising 10% titanium by weight and 90% tungsten by weight. Because capping layer 106 is subsequently used as a mask to pattern bulk conductor 104 into a first interconnection (metal-1), capping layer 106 and bulk conductor 104 must be formed from materials which can be selectively etched. Additionally, capping layer 108 should be formed thick enough to provide a suitable mask for patterning bulk conductor 104.

After deposition of capping layer 106, as shown in FIG. 1a, a photoresist layer is deposited onto capping layer 106 and masked, exposed and developed to define a photoresist pattern 108 which defines the pattern desired for the first level of metal interconnections. Next, as shown in FIG. 1a, capping layer 106 is antisotropically etched in alignment with photoresist pattern 108 to form a patterned capping layer 110 which is a substantial replica of photoresist pattern 108. An overetch is preferably utilized to ensure complete removal of all exposed portions of capping layer 106 (i.e. those areas not covered by mask 108). If bulk conductor 104 is an aluminum alloy and capping layer 106 is a titanium-tungsten layer, then a reactive ion etch (RIE) utilizing a chemistry comprising $C_2F_6$ can be used to form patterned capping layer 110.

Figure 1B:
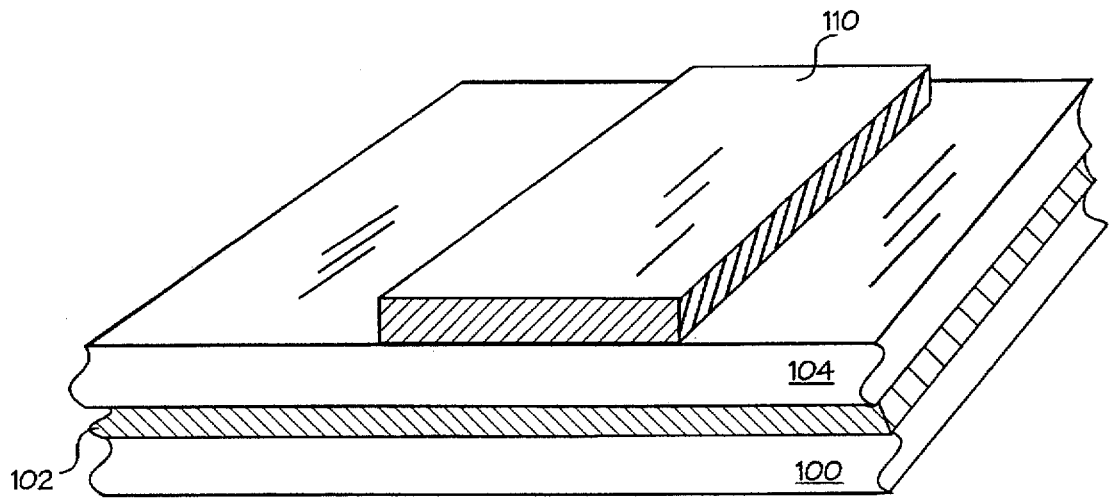

Next, as shown in FIG. 1b, photoresist mask 108 is stripped by any one of a plurality of well known techniques. As shown in FIG. 1b, capping layer 106 has been formed into a pattern desired for the first interconnection level, while bulk conductor 104 remains substantially unetched. It is to be noted that only a small step height is created by patterned capping layer 110 and bulk conductor 104. Such a small step height allows for good thin film coverage and helps reduce stringer formation during subsequent etching.

Figure 1C:
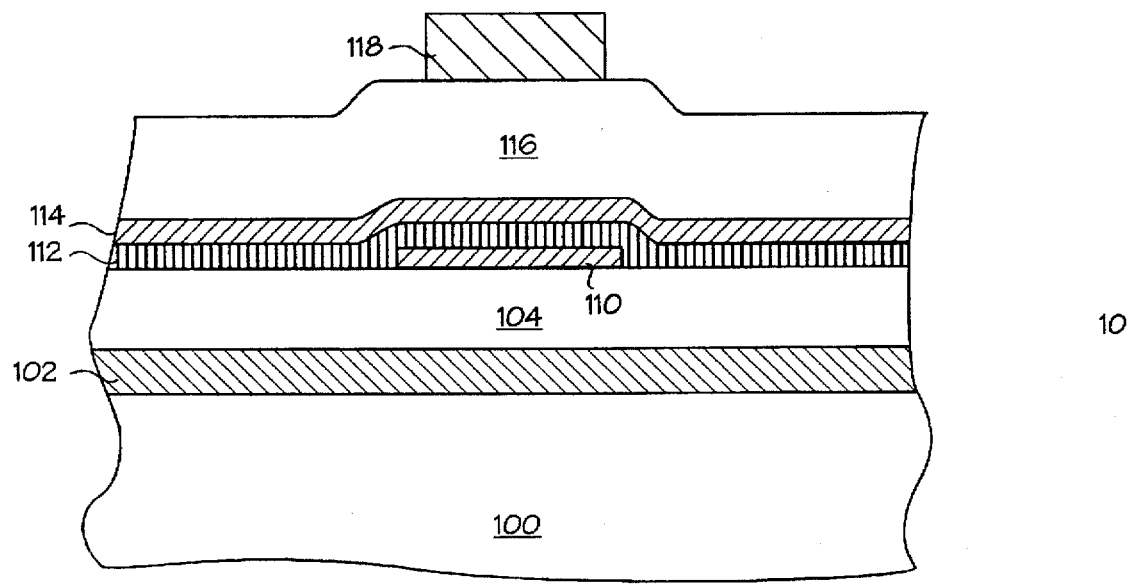
FIG. 1c is an illustration of a cross-sectional overhead showing the formation of an amorphous silicon layer, a titanium-tungsten barrier layer and an aluminum layer over the substrate of FIG. 1b.

Next, an antifuse layer 112 is blanket deposited over bulk conductor 104 and pattern capping layer 110 as shown in FIG. 1c. Layer 112 is said to be an "antifuse layer" because in its deposited state it does not substantially conduct electricity, but may be irreversibly altered into a conductive state. In the first preferred method of the present invention, antifuse layer 112 is preferably amorphous silicon deposited by any well known technique to a thickness in the range of 500-2000 Å. Antifuse layer 112 is formed to a thickness sufficient to provide a suitable antifuse.

Next, as shown in FIG. 1c, a barrier layer 114 is blanket deposited over antifuse layer 112. A bulk conductor 116 is then blanket deposited over barrier layer 114. In the preferred method of the present invention bulk conductor 116 is an aluminum alloy layer formed by sputtering, however, any well known conductor with a suitable resistivity can be utilized. Barrier layer 114 prevents electromigration and diffusion of atoms out of bulk conductor 116 and into antifuse layer 114. Such a diffusion could cause a short across antifuse layer 112, rendering antifuse layer 112 conductive and therefore obsolete. Barrier layer 114 is preferably formed of the same material as patterned capping layer 110, which in the preferred embodiment of the present invention is titanium-tungsten formed by sputtering to a thickness of approximately 2000 Å. It is to be appreciated that antifuse layer 112, barrier layer 114 and bulk conductor 116 are preferably formed in a single pass through deposition machine to insure clean interfaces between respective layers.

Next, a photoresist layer is blanket deposited over bulk conductor 116 and patterned with well known photolithographic techniques into a photoresist mask 118 defining a location over patterned capping layer 110 where an antifuse metal post is to be formed. It is to be noted that photoresist mask 118 is formed over a planar portion of patterned capping layer 110, as shown in FIG. 1c, in order to generate a planar antifuse.

Figure 1D:
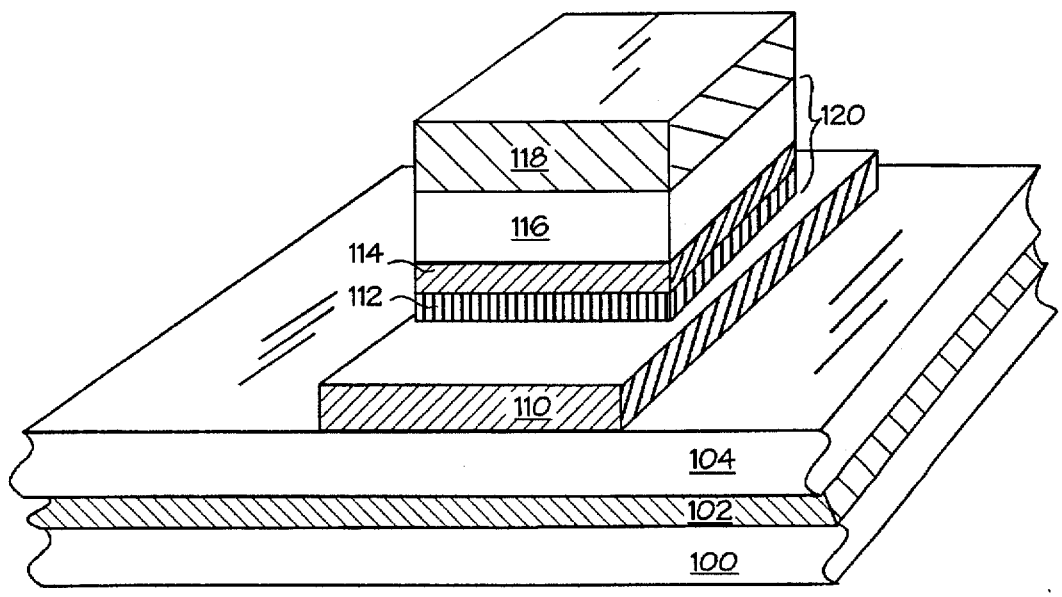
FIG. 1d is an illustration of a cross-sectional overhead view showing the formation of a photoresist mask and the formation of a metal post over the substrate of FIG. 1c.

Next, bulk conductive layer 116, barrier layer 114, and antifuse layer 112 are antisotropically etched in alignment with photoresist mask 118. The antisotropic etch is continued until patterned capping layer 110 is exposed as shown in FIG. 1d. It is important that the etching of antifuse layer 112 not destroy patterned capping layer 110 which is needed for a mask for subsequent patterning of bulk conductor 104. The antisotropic etch forms an antifuse metal post 120 on patterned capping layer 110. If bulk conductor layer 116 is an aluminum layer, and barrier layer 114 is a titanium-tungsten layer, and antifuse layer 112 is an amorphous silicon layer, and patterned capping layer 110 is a titanium-tungsten layer, then bulk conductive layer 116 can be reactive ion etched (RIE) utilizing a chlorine chemistry, such as $Cl_2$ or $BCl_3$, and barrier layer 114 can be reactive ion etched utilizing a fluorine chemistry, such as $C_2F_6$, and antifuse layer 112 can be reactive ion etched utilizing a chlorine chemistry, such as $Cl_2$.

Figure 1E:
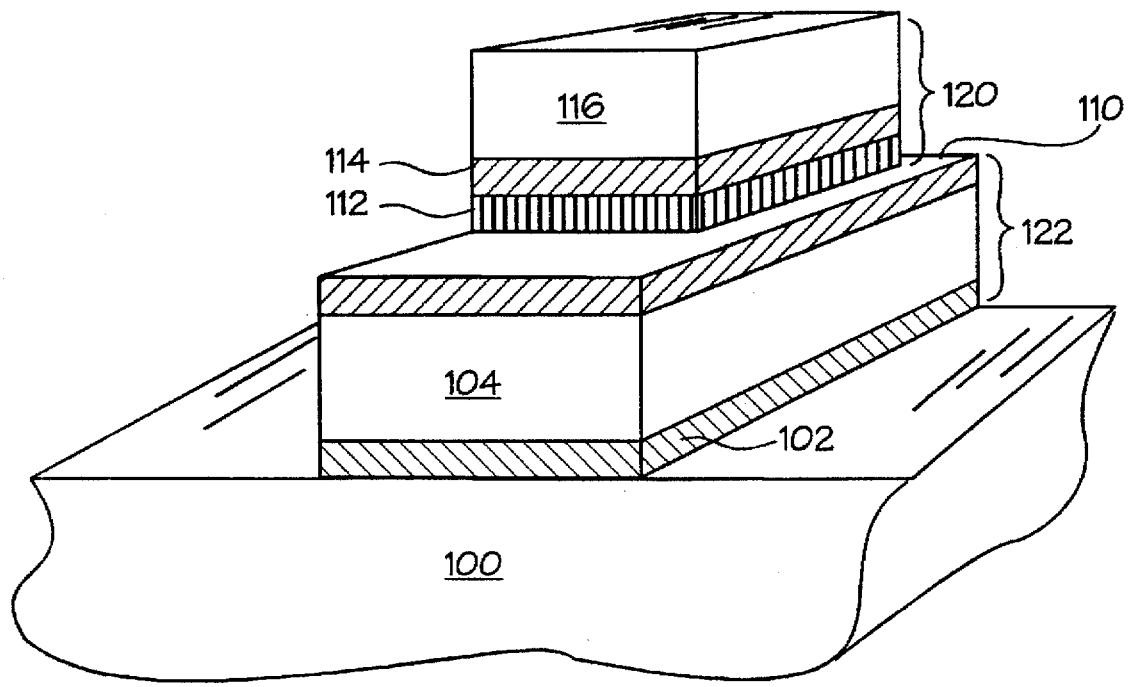
FIG. 1e is an illustration of a cross-sectional overhead view showing the formation of a first metal interconnect on the substrate of FIG. 1d.

Next, as shown in FIG. 1e, substrate 100 is further antisotropically etched to pattern bulk conductor 104 into a first metal interconnect 122. An etchant which is highly selective to patterned capping layer 110 with respect to bulk conductor 104 is used. In this way, patterned capping layer 110 provides a mask for the etching of bulk conductor 104. Bulk conductor 104 and first barrier layer 102, if provided, are antisotropically etched down to substrate 100 in alignment with patterned capping layer 110 to form a first level of interconnection 120 (i.e. metal-1) If capping layer 110 is a titanium-tungsten layer and bulk conductor 104 is a film comprising aluminum, then a reactive ion etch (RIE) utilizing a chemistry comprising chlorine, such as but not limited to, $Cl_2$ and $BCl_3$, can be used to pattern bulk conductor 104.

After etching bulk conductor 104, photoresist mask 110 is stripped with well known techniques. The result of the above references steps, as shown in FIG. 1e, is the formation of a first metal interconnect 122 on substrate 100 and the formation of an antifuse metal post 120 on interconnection 122.

Figure 1F:
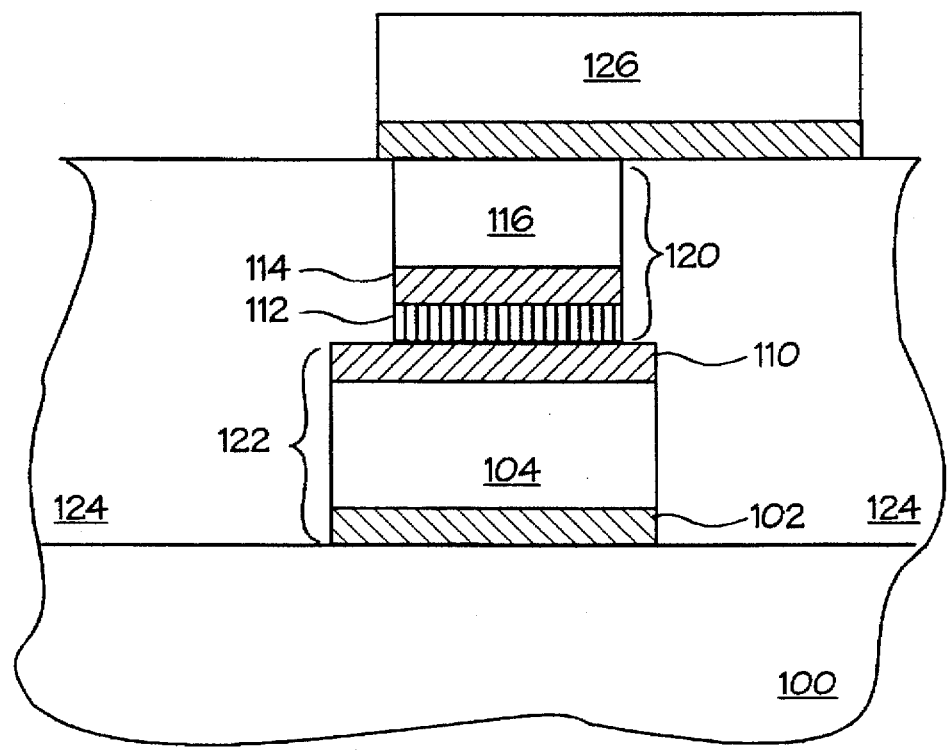
FIG. 1f is an illustration of a cross-sectional view showing the formation and planarization of an insulating layer and subsequent formation of a second metal interconnect on the substrate of FIG. 1e.

An interlayer dielectric 124, such as but not limited to, an undoped oxide, doped oxide, spin on glass, nitride, or any combination thereof, can now be blanket deposited with well known techniques over substrate 100 including first metal interconnect 122 and antifuse metal post 120. Interlayer dielectric (ILD) 124 can then be planarized by, for example, well known chemical-mechanical polishing techniques to reveal the top surface of bulk conductor 120, as shown in FIG. 1f. A second metal interconnection 126 can then be formed on ILD 124 and bulk conductor 120 with well known techniques, such as blanket deposition, photoresist patterning and etching. Antifuse layer 112 can be rendered conductive, when desired, by simply applying a sufficient voltage between antifuse metal post 120 and first interconnect 122.

It is to be noted that the preferred antifuse of the present invention is rendered conductive by applying sufficient voltage to drive a current across titanium-tungsten barrier layer 114, amorphous silicon antifuse layer 112, and patterned titanium-tungsten capping layer 110, and cause local heating of these layers and the conversion of the amorphous silicon antifuse layer 112 into a conductive silicide. As such, patterned capping layer 110 and barrier layer 114 need to be formed of a material, such as but not limited to, titanium and tungsten, which can react with antifuse layer 112 and form a suitably low resistance silicide. Additionally, it is to be appreciated that barrier layer 114, patterned capping layer 110, and antifuse layer 112 should be formed to thicknesses sufficient to allow complete conversion of antifuse layer 112 into a silicide.

The antifuse of the present invention is characterized by the planar fusing interfaces of patterned capping layer 110 and barrier layer 114. As such, the antifuse of the present invention does not suffer from geometry or topography induced high e-fields. Additionally, the fabrication method of the present invention provides clean and controllable fused surfaces (i.e. patterned capping layer 110 and barrier layer 114) which provide excellent antifuse performance.

Although the present invention has been described with respect to specific details such as dimensions, materials and interconnect levels, it is to be appreciated that such specific details are not to be taken as limiting. For example, although the present invention was described with respect to forming an antifuse between a first level of interconnection and a second level of interconnection one skilled in the art will appreciate the ability to form the antifuse of the present invention, between other interconnection levels, such as interconnection level 2 and interconnection level 3. As such, the scope of the present invention is not to be taken as limiting, but rather as illustrative, wherein the scope of the present invention is to be determined by the claims which follow.

Thus, a planar antifuse and its method of fabrication has been fabricated.

I claim:

1. A method of forming an antifuse comprising the steps of:

forming a first metal layer, said first metal layer comprising a first bulk conductive layer and a top capping layer;

etching said top capping layer into a first patterned capping layer;

forming an antifuse layer over said first patterned capping layer and over said first bulk conductive layer;

forming a second metal layer comprising a bottom barrier layer and a second bulk conductive layer on said antifuse layer;

etching said second metal layer and said antifuse layer to form an antifuse metal post on said capping layer; and after forming said antifuse metal post etching said first bulk conductive layer in alignment with said first patterned capping layer to form a first metal interconnect.

2. The method of claim 1 wherein said antifuse layer is amorphous silicon.

3. The method of claim 1 wherein said capping layer comprising titanium-tungsten.

4. The method of claim 1 wherein said bottom barrier layer comprises titanium-tungsten.

5. The method of claim 1 wherein said first bulk conductive layer comprises aluminum.

6. The method of claim 1 wherein said second bulk conductive layer comprises aluminum.

7. The method of claim 6 wherein said bottom barrier layer comprises a refractory metal.

8. The method of claim 1 further comprising the steps of blanket depositing an insulating layer over said antifuse metal post and said first metal interconnect and planarizing said insulating layer to uncover the top surface of said antifuse metal post.

9. The method of claim 8 further comprising the step of forming a second interconnect on said planarized insulating layer and in contact with said antifuse metal post.

10. The method of claim 1 wherein said capping layer comprises a refractory metal.

11. A method of forming an anti-fuse comprising the steps of:

forming a first metal layer comprising aluminum;

forming a first titanium-tungsten layer on said first metal layer, patterning said first titanium-tungsten layer into a first pattern desired for a first metal interconnect;

forming an amorphous silicon layer on said first titanium-tungsten layer patterned into a first pattern for a first metal interconnect and said first metal layer comprising aluminum;

forming a second titanium-tungsten layer on said amorphous silicon layer;

forming a second metal layer comprising aluminum on said second titanium-tungsten layer;

forming and patterning a photoresist layer to form a photoresist mask over a location of said second metal layer where an antifuse is desired;

etching said second metal layer comprising aluminum, said second titanium-tungsten layer and said amorphous silicon layer in alignment with said photoresist mask; and after etching said second metal layer comprising aluminum, said second titanium-tungsten layer and said amorphous silicon layer, etching said first metal layer comprising aluminum in alignment with said patterned first titanium-tungsten layer.

* * * * *